(12) United States Patent
Schilling et al.

(10) Patent No.: US 7,986,005 B2
(45) Date of Patent: Jul. 26, 2011

(54) SHORT CIRCUIT LIMITING IN POWER SEMICONDUCTOR DEVICES

(75) Inventors: Oliver Schilling, Warstein (DE); Frank Pfirsch, Munich (DE)

(73) Assignee: Infineon Technologies Austria Ag, Villach (AT)

( * ) Notice: Subject to any disclaimer, the term of this patent is extended or adjusted under 35 U.S.C. 154(b) by 488 days.

(21) Appl. No.: 11/829,311

(22) Filed: Jul. 27, 2007

(65) Prior Publication Data

US 2009/0026532 A1 Jan. 29, 2009

(51) Int. Cl.
*H01L 29/78* (2006.01)
(52) U.S. Cl. ........ 257/341; 257/342; 257/343; 257/339; 257/E29.257; 257/E29.258; 257/E29.259; 257/E29.26
(58) Field of Classification Search ............ 257/316, 257/321, 339, 341, 314, 315, 342, 343, E29.257, 257/E29.258, E29.259, E29.26
See application file for complete search history.

(56) References Cited

U.S. PATENT DOCUMENTS

| 5,164,802 A * | 11/1992 | Jones et al. ............ 257/337 |
| 5,545,908 A * | 8/1996 | Tokura et al. ............ 257/341 |
| 6,882,573 B2 * | 4/2005 | Blanchard ............ 365/185.23 |
| 2006/0060916 A1 | 3/2006 | Girdhar et al. |

FOREIGN PATENT DOCUMENTS

WO WO 8404197 A1 * 10/1984

* cited by examiner

*Primary Examiner* — Jerome Jackson, Jr.
*Assistant Examiner* — Yu Chen
(74) *Attorney, Agent, or Firm* — Dickstein Shapiro LLP

(57) ABSTRACT

A power semiconductor device includes a semiconductor body. The semiconductor body includes a body region of a first conductivity type for forming therein a conductive channel of a second conductivity type; a gate electrode arranged next to the body region; and a floating electrode arranged between the gate electrode and the body region.

14 Claims, 8 Drawing Sheets

SHORT CIRCUIT LIMITING IN POWER SEMICONDUCTOR DEVICES

BACKGROUND OF THE INVENTION

Power semiconductor devices such as power FETs (Field Effect Transistor) and IGBTs (Insulated Gate Bipolar Transistor) are capable of switching large voltages and currents and are therefore used for controlling electrical energy applied to a load such as an electrical motor.

During operation of power semiconductor devices short circuits may occur which could jeopardise the stability of the device since the thermal dissipation loss generated during a short circuit could destruct the device.

BRIEF SUMMARY OF THE INVENTION

According to an embodiment, a power semiconductor device is provided. The power semiconductor device comprises a semiconductor body. The semiconductor body comprises a body region of a first conductivity type for forming therein a conductive channel of a second conductivity type, and a drift region of the second conductivity type in contact with the body region. A gate electrode is arranged next to the body region; and a floating electrode is arranged between the gate electrode and the body region.

According to certain embodiments, the power semiconductor device comprises a floating electrode arranged between the gate electrode and the body region. During a short circuit, charge carriers in the conductive channel formed in the body region may become injected into, and trapped in, the floating electrode. The trapped charge carriers shift the threshold voltage of the power semiconductor device to a higher value which in turn decreases the conductivity of the channel. This will result in an effective reduction or limitation of the short circuit current and hence improves the reliability of the power semiconductor device.

BRIEF DESCRIPTION OF THE SEVERAL VIEWS OF THE DRAWINGS

A full and enabling disclosure of the present invention, including the best mode thereof, to one of ordinary skill in the art, is set forth more particularly in the remainder of the specification, including reference to the accompanying figures. Therein.

DETAILED DESCRIPTION OF THE INVENTION

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor wafer or die.

The term "vertical" as used in this specification intends to describe an orientation which is arranged perpendicular to the main surface of the semiconductor wafer or die.

Specific embodiments described in this specification pertain to power semiconductor devices and particularly to field-effect controlled power semiconductor devices such as FETs and IGBTs.

Figure 1:
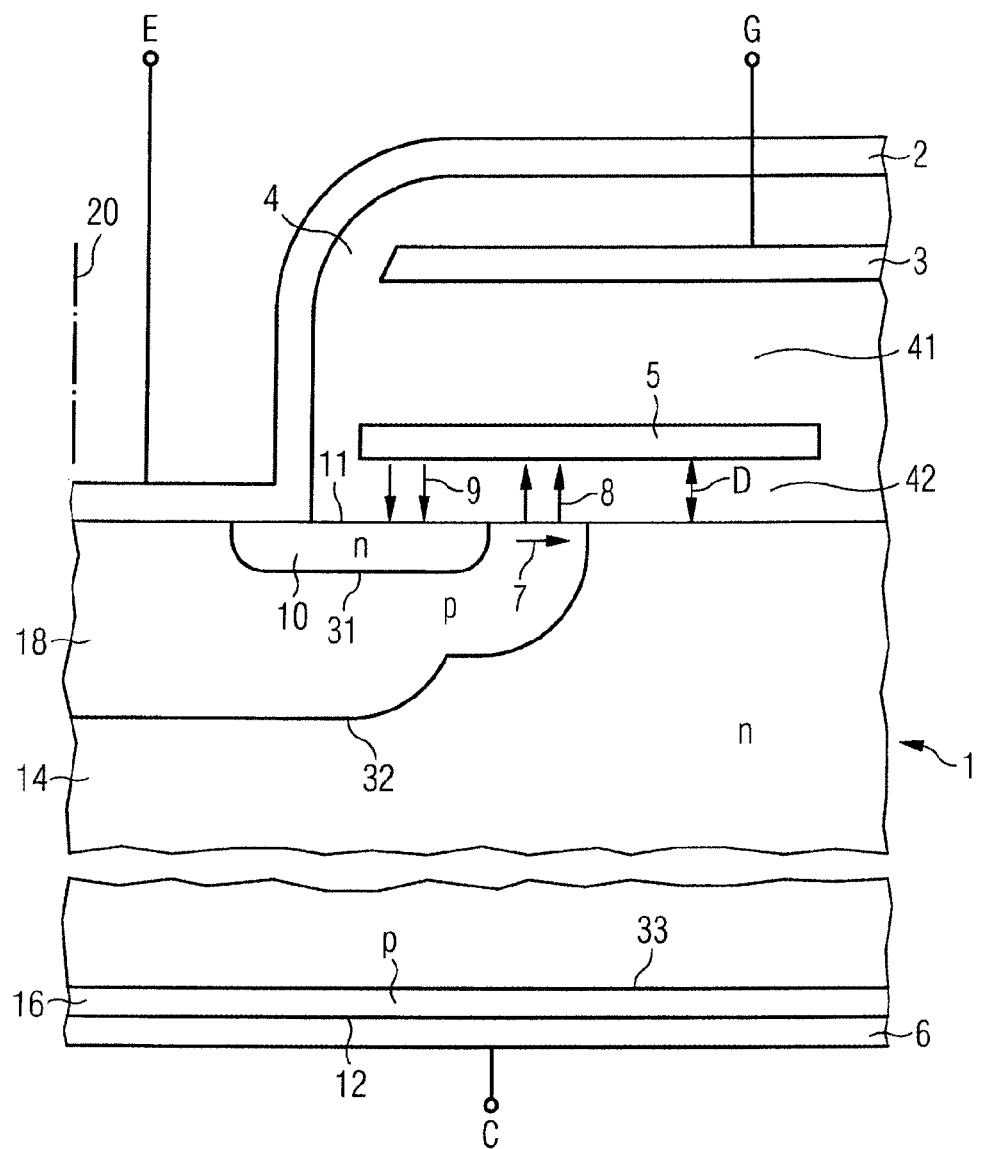
FIG. 1 shows an arrangement of a semiconductor power device according to an embodiment.

FIG. 1 shows a power semiconductor device embodied as IGBT. The power semiconductor device comprises a semiconductor body 1, which can be for instance comprised of a monocrystalline silicon (Si) or silicon carbide (SiC) wafer or die. The material of the semiconductor body 1 is not limited to the above materials and can also include heterojunction materials such as Si/SiC and III-V semiconductors such as GaAs. In certain embodiments, the semiconductor body is n-doped and has a background doping concentration of about $10^{13}/cm^3$ to about $10^{15}/cm^3$. In this embodiment, n-doped is referred to as second conductivity type; wherein p-doped is referred to as first conductivity type as indicated in FIG. 1. It will be, however, appreciated by those skilled in the art that the doping can be reversed.

The main portion of the semiconductor body 1 forms a drift area 14 of the power semiconductor device as becomes more apparent below.

The semiconductor body 1 comprises a first surface 11 and a second surface 12 which is arranged opposite to the first surface 11. The first surface 11 is in this embodiment the main surface of the power semiconductor device.

A body region 18 of a first conductivity type is formed in the semiconductor body 1 at the first surface 11 thereof. The body region 18 has a typical doping concentration of about $10^{16}/cm^3$ to about $10^{18}/cm^3$. A pn-junction 32 is formed between the body region 18 and the drift region 14. In operating the semiconductor device, the pn-junction 32 is typically reversed biased.

Embedded in the body region 18, there is arranged a source region 10 of the second conductivity type, which is formed at the first surface 11. Source region 10 is insulated from drift region 14 by body region 18, and has a typical doping concentration of about $10^{19}/cm^3$ to about $10^{21}/cm^3$. The area of the body region 18 at the first surface 11 between the source region 10 and the drift region 14 is referred to as channel region since a conductive channel of the second conductivity type (in this embodiment n-type) will be formed therein during operation. A pn-junction 31 is formed between the source region 10 and the body region 18. In operating the power semiconductor device, the pn-junction 31 is typically forward biased or short circuited by a front metallization.

In operating the power semiconductor device, the conductive channel will be formed in the body region along the first surface between the source region 10 and the drift region 14. The conductive channel is a voltage-controllable conductive connection between the source region 10 and the drift region 14, wherein the conductive channel is controlled by a voltage applied to a gate electrode described below. In FIG. 1, the conductive channel is indicated by arrow 7 which denotes the flow of charge carriers in forward mode of the power semiconductor device.

For generating and controlling the conductive channel, a gate electrode 3 is arranged on the first surface 11 of the semiconductor body 1 next or adjacent to the body region 18 and particularly vertically above the region of the conductive channel (portion of the body region 18, which is arranged between the source region 10 and the drift region 14). The gate electrode 3 is arranged in spaced relation to the first surface 11 and insulated therefrom by means of an insulating layer. The gate electrode 3 is provided with a gate contact G which is connected to a gate driver (not shown) for supplying a gate voltage to the gate electrode 3 in order to generate and control the conductive channel.

A floating electrode 5 is arranged between, and insulated to, the semiconductor body 1, particularly the body region 18, and the gate electrode 3. Between the first surface 11 of the semiconductor body 1 and the floating electrode 5 there is arranged a tunnelling dielectric layer 42. Further, a gate dielectric layer 41 is arranged between the floating electrode 5 and the gate electrode 3 for insulating the floating electrode 5 from the gate electrode 3. The floating electrode 5 is under normal operating conditions completely insulated from both the semiconductor body 1, including the body region 18 and the source region 10, and the gate electrode 3. Hence, the electrical potential of the floating electrode 5 cannot be clamped to an externally provided electrical potential but is floatable. The floating electrode 5 and the gate electrode 3 are capacitively coupled. The floating electrode 5 also capacitively couples with the body 18.

In certain embodiments the tunnelling dielectric layer 42 can be a tunnelling oxide layer which, for example, comprises silicon oxide. Suitable oxides can be produced by thermally oxidising the surface of the semiconductor body 1. Generally, the tunnelling dielectric layer 42, particularly its thickness D, is adapted such that it enables a generation of a tunnelling current therethrough for at least partially charging the floating electrode 5 under short-circuit conditions and when the conductive channel is formed in the body region 18. Typically, the thickness D of the tunnelling dielectric layer 42 is smaller than the thickness of the gate dielectric layer 41 and can range from about 2 nm to about 20 nm. The thickness D of the tunnelling dielectric layer 42 can vary when using different dielectric materials.

The tunnelling dielectric layer 42 is arranged at least above the body region 18. However, as shown in FIG. 1, the tunnelling dielectric layer 42 can also be partially arranged next to and above the source region 10. In this case, the portion of the tunnelling dielectric layer 5 arranged next to the body region 18 is referred to as first portion and the portion of the tunnelling dielectric layer 42 arranged next to the source region 10 is referred to as second portion. Further, the tunnelling dielectric layer 42 may also be partially arranged next to and above the drift region 14 as shown in FIG. 1. This portion is referred to as third portion.

At the second surface 12, an emitter region 16 of the first conductivity type (p-type in this embodiment) is formed in the semiconductor body 1. The emitter region 16 adjoins the drift region 14 and forms a pn-junction 33 with the drift layer 14, which is typically forward biased during operation of the power semiconductor device. The emitter region 16 has a typical doping concentration ranging from about $10^{17}/cm^3$ to about $10^{20}/cm^3$. For connecting the emitter region 16, a back metallization 6 connected to a so-called collector contact C is arranged on the second surface 12 of the semiconductor body 1. In case of a power-FET, the emitter region 16 is omitted and a highly doped drain region of the second conductivity type is formed.

A front metallization 2 is arranged on the first surface 11 of the semiconductor body 1 for contacting the source region 10 and the body region 18. This results in short circuiting the pn-junction 31 between the body region 18 and the source region 1. The front metallization 2 is connected to a so-called emitter contact E and is insulated from the gate electrode 3 and the floating electrode 5 by an insulation 4, which covers in this embodiment a layer stack formed by the tunnelling dielectric layer 42, the floating electrode 5, the gate dielectric layer 41 and the gate electrode 3. The arrangement of the power semiconductor device is typically symmetrical with respect to a vertical axis 20 shown in FIG. 1, wherein the arrangement can have a periodical structure to form a plurality of parallely connected cells.

Subsequently, the operation of the power semiconductor device will be explained. The power semiconductor device is typically used for controlling high load currents. The emitter contact E and the collector contact C are connected to a load circuit which includes a current or voltage source (not shown). A positive voltage with respect to the voltage applied to the emitter contact E is applied to the collector contact C which causes the pn-junction 32 between the body region 18 and the drift region 14 to be in reverse mode. Since the source region 10 and the drift region, respectively, are n-doped and the body region 18 and the emitter region 16, respectively, are p-doped in the embodiment shown in FIG. 1, a positive voltage with respect to the voltage applied to the emitter contact E is applied to the gate contact G for generating a conductive channel in the body region 18. When the voltage applied to the gate electrode 3 exceeds a so-called threshold voltage, sufficient electrons (charge carriers) are attracted in the body region 18 that a thin n-type conductive channel is formed underneath the gate electrode 3 between the drift region 14 and the source region 10. The thus formed conductive channel allows an electrical current to be flown from the source region 10 to the drift region 14.

In common power semiconductor devices, which do not comprise a floating electrode, the threshold voltage is determined by the doping profile of the p-body region, the thickness and the dielectric constant of the gate dielectric layer, which is arranged between the gate electrode and the body region, and is specific for a given design. In the power semiconductor device described in this specification, the threshold voltage is determined by the doping profile of the p-body region, the thickness and the dielectric constant of the gate dielectric layer 41 and the tunnelling dielectric layer 42. The effect of the floating electrode 5 on the threshold voltage will be described later.

Typically, the voltage applied to the gate electrode 3, referred to a as VGE (voltage between emitter contact E and gate contact G), is in the range of the threshold voltage (or slightly higher) to ensure a reliable formation of the conductive channel. The electrical current through the conductive channel is indicated in FIG. 1 by arrow 7.

When a short circuit occurs in the load circuit, a high electrical current flows from the emitter contact E through the conductive channel to the collector contact C. A high electrical current results in high thermal dissipation losses which can cause a damage or failure of the semiconductor devices. To reduce the short circuit current, the power semiconductor device as described herein is capable of dynamically and reversibly increasing the threshold voltage by charging the floating electrode 5 with charge carriers (electrons). Under short circuit conditions, electrons flowing through the conductive channel are attracted by the positively charged gate electrode 3. Eventually, the electrons exhibit sufficient energy to surmount the potential barrier provided by the tunnelling dielectric layer 42. The mechanism behind this, without being limited thereto, is based on hot carrier injection. The term "hot carrier injection", as used in this specification, intends to describe charge carriers which have gained sufficient kinetic energy to overcome the potential barrier provided by the tunnelling dielectric layer 42. Short circuit conditions may provide sufficient energy so that electrons, due to their attraction by the voltage applied to the gate electrode 3, may be able to pass the relatively thin tunnelling dielectric layer 42. The electrons, however, which have passed the tunnelling dielectric layer 42, are trapped on the floating electrode 5 and cannot flow to the gate electrode 3, since the gate dielectric layer 42 is typically thicker than the tunnelling dielectric layer and inhibits a charge carrier flow.

The negative charges stored on the floating electrode 5 reduce the electrical potential of the floating electrode 5 with respect to the gate electrode 3 which leads to a reduction of the electrical field between the floating electrode 5 and the body region 18 since the trapped negative charges counteract the voltage applied to the gate electrode 3. By reducing the electrical field, the resistivity of the conductive channel increases which in turn reduces the electrical current flowing through the conductive channel, because the conductivity of the conductive channel depends on the electrical field. Hence, the short circuit current can be limited and the thermal dissipation losses reduced, which improves the reliability of the power semiconductor device.

The effect of the charged floating electrode 5 on the conductive channel can also be explained as a shift of the power semiconductor device's threshold. The threshold voltage Vth of the power semiconductor device, as used in this specification, is referred to as the lowest voltage, which needs to be applied to the gate electrode 3, to generate a conductive channel in the body region 18. Assume that no charge carriers (electrons) are trapped on the floating electrode 5, i.e. the floating electrode 5 is not charged. In this case, the threshold voltage is denoted by Vth0 and mainly defined by the arrangement of and the materials used for the power semiconductor device, particularly by the doping profile of the p-body region, the thickness and the di-electric constant of the gate dielectric layer 41 and the tunnelling dielectric layer 42. To generate a conductive channel in the body region 18, a voltage (VGE) equal to or higher than the threshold voltage Vth0 needs to be applied to the gate electrode 3. On the other hand, when electrons are trapped on the floating electrode 5, a voltage higher than Vth0 needs to be applied to the gate electrode 3 to generate a conductive channel in the body 18 since the trapped electrons weakens the electrical field provided by the applied voltage VGE. This is equivalent to an effective increase of the threshold voltage. Hence, the power semiconductor device exhibits an effective threshold voltage Vth after a tunnelling of charged carriers has occurred. The threshold voltage Vth is thus also a function of the amount of charge stored in the floating electrode 5 and is not fixed unlike in common power semiconductor devices.

In other words, the negative charge stored on the floating electrode shifts the threshold to higher values such that the short circuit current can be reduced.

The flow of charge carriers to the floating electrode 5 is referred to as a first tunnelling current 8 (a tunnelling current caused by a short circuit). Since the trapped charge carriers would permanently increase the threshold voltage of the power semiconductor device, a predefined voltage is applied to the gate electrode 3 to cause a second tunnelling current 9 which is opposite to the first tunnelling current 8. Thus, the amount of charge stored on the floating electrode 5 can be changed by applying the pre-defined voltage. Typically, the second tunnelling current 9 substantially completely discharges the floating electrode 5 which results in a reduction of the threshold voltage which will assume Vth0 again or a value close to it. Without being wished to be limited, it is assumed that the second tunnelling current 9 is base on Fowler-Nordheim tunnelling.

By bringing the threshold value Vth back to Vth0 after a short circuit has occurred, the power semiconductor device can operate in normal mode with Vth0, so that losses including on-state losses and switching losses can effectively be reduced.

Based on the above described mechanisms for the first and second tunnelling currents, the first tunnelling current 8 is a current which flows from the conductive channel (body region 18) to the floating electrode 5. Different thereto, the second tunnelling current 9 can flow from the floating electrode 5 to the body region 18 and the source region 10, both of which are typically fixed to the same electrical potential.

The generation of the first tunnelling current 8 is influenced, and can be at least partially controlled, by the thickness and the material of the tunnelling dielectric layer 42. By appropriately adjusting the thickness D of the tunnelling dielectric layer 42, particularly in the area of the conductive channel (body region 18), and selecting the material for the tunnelling dielectric layer 42 it is possible to pre-define the conditions at which tunnelling occurs. For example, the thinner the tunnelling dielectric layer 42 is, the more likely is that tunnelling occurs so that a significant first tunnelling current 8 can be observed at lower short circuit currents. This allows adjusting of the onset of the tunnelling current with respect to the current intensity during a short circuit. On the other, the tunnelling dielectric layer 42 should be sufficiently dimensioned to avoid a tunnelling current during normal mode. The floating electrode 5 is therefore insulated from the semiconductor body 1 by an appropriately adjusted tunnelling dielectric layer 42 such that no tunnelling occurs during normal mode but that a tunnelling current (first tunnelling current 8) is generated between the surface of the semiconductor body 1 and the floating electrode 5 at predetermined conditions. In other words, the thickness of the tunnelling dielectric layer 42 is adjusted such that the first tunnelling current 8 is generated for storing negative charges on the floating electrode 5 when the negative charge carriers in the conductive channels have a sufficiently high energy, which may happens under short circuit conditions in the external load circuit and when the conductive channel is turned on.

With respect to FIG. 2, another embodiment will be described. Contrary to the embodiment shown in FIG. 1, the floating electrode 5 comprises a first portion 51 and a second portion 52 which have different vertical distances to the first surface 11 of the semiconductor body 1. The first portion 51 is arranged next to the body region 18 and the second portion 52 is arranged next to the source region 10, wherein the first portion 51 has a distance to the semi-semiconductor body 1 which is larger than the distance of the second portion 52 to the semiconductor body 1. Correspondingly, the tunnelling dielectric layer 42 comprises a first portion 61 and a second portion 62. The first portion is arranged between the body region 18 and the floating electrode 5 and the second portion is arranged between the source region 10 and the floating electrode 5. The thickness D1 of the first portion 61 is larger than the thickness D2 of the second portion 62.

The reduced thickness D2 of the second portion 62 of the tunnelling dielectric layer 42 reduces the voltages required to discharge the floating electrode 42. Since the first tunnelling current is formed by hot carriers generated in the conductive channel, the distance between the source region 10 and the floating electrode 5 does not influence the onset of the first tunnelling current 8. On the other hand, the stored charge carriers can more easily flow to the source region 10; hence, the second tunnelling current 9 can be initiated by a lower voltage. Apart from reducing the voltage needed for discharging the floating electrode 5, the stress exerted by the charge carriers flowing through the first portion 61 of the tunnelling dielectric layer 42 can be reduced since the second tunnelling current 9 will mainly only flow through the second portion 62 of the tunnelling dielectric layer 42 and not through its first portion 61.

The thickness D2 of second portion 62 of the tunnelling dielectric layer 42 can be reduced, with respect to the thickness D1 of the first portion 61. Typically, the ratio D1:D2 is about 2:1 to about 10:1.

Figure 2:
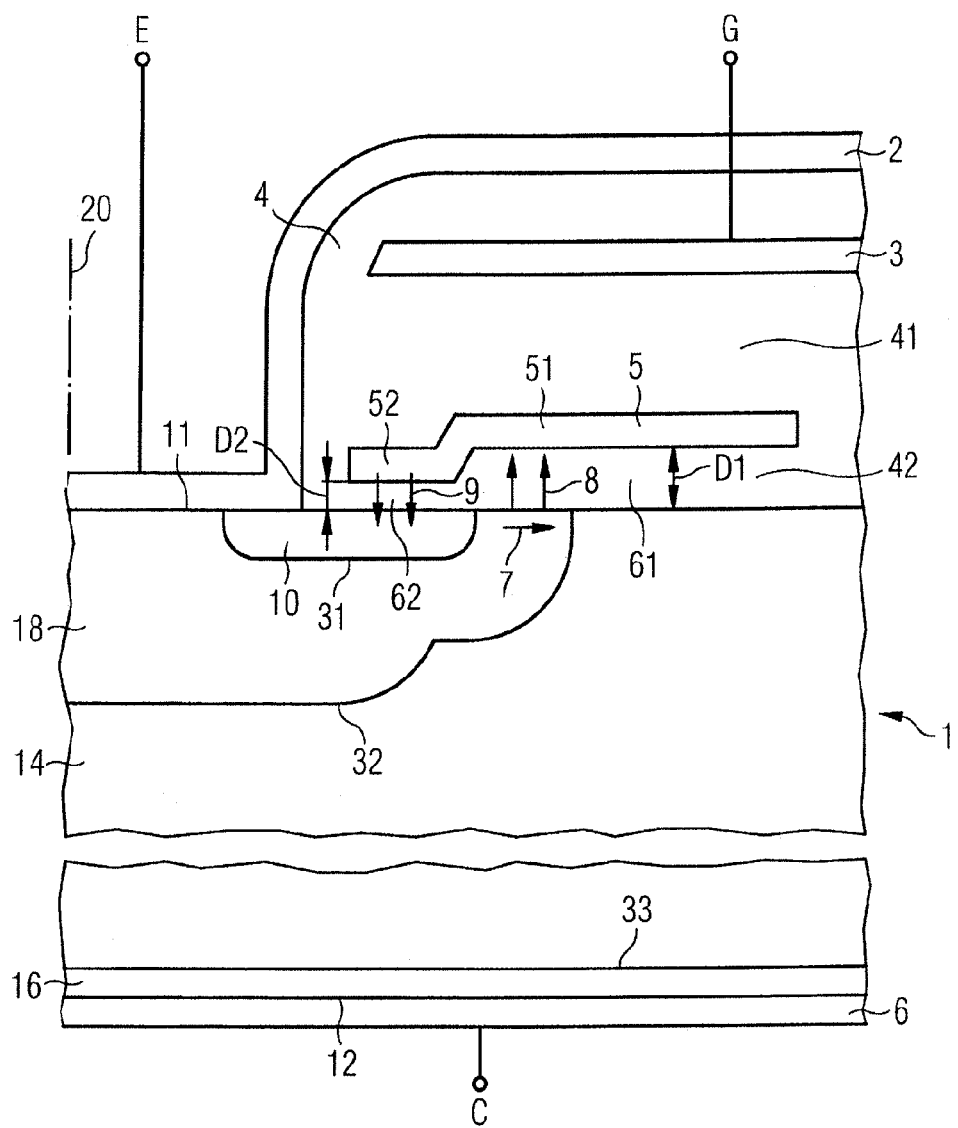
FIG. 2 shows an arrangement of a semiconductor power device according to another embodiment.

The embodiments shown in FIGS. 1 and 2 pertain to power semiconductor devices having a gate electrode 3 arranged on the first surface 11 of the semiconductor body 1. Since the conductive channel is formed parallel to the first surface 11, such a configuration is also known as a planar device.

Figure 3:
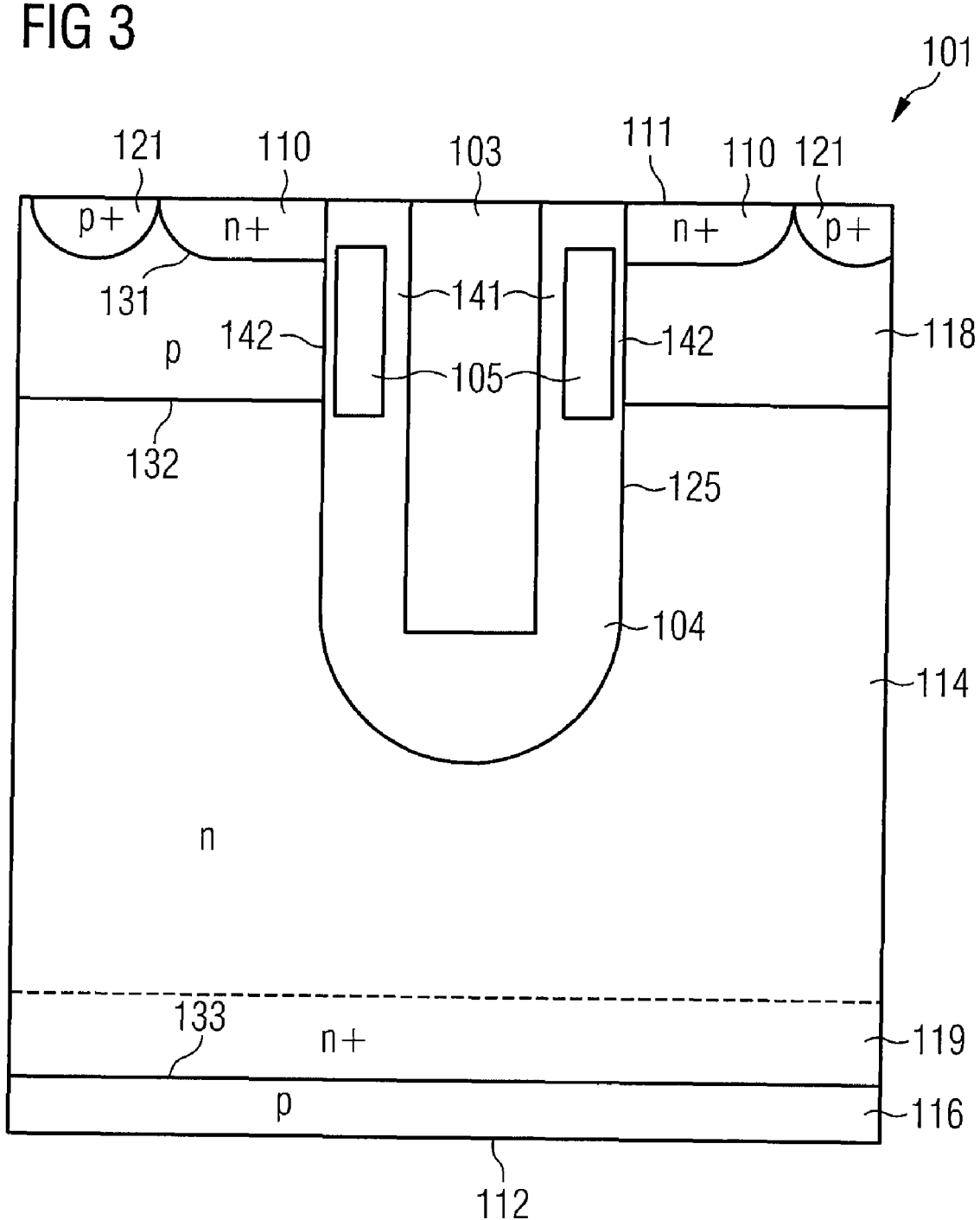
FIG. 3 shows an arrangement of a semiconductor power device according to another embodiment.

Contrary thereto, FIG. 3 shows an embodiment of a power semiconductor device having a gate electrode 103 which is arranged in a trench 125 which extend vertically from the first surface 111 towards the second surface 112 in a semiconductor body 101. The gate electrode 103 also extends vertically and is made parallel to side surfaces of the trench 125. A body region 118 is formed in the semiconductor body 101 close to its first surface 111. Source regions 110 and body contact regions 121 are embedded in the body region 118 at the first surface 111. Body contact regions 121 are of the first conductivity type and higher doped than the body region 118. Typically, the doping concentration of the body contact regions 121 ranges from about $10^{18}/cm^3$ to about $10^{20}/cm^3$. The doping concentration of the other regions is similar to the doping concentration as described in conjunction with the embodiments shown in FIGS. 1 and 2. A floating electrode or floating electrodes 105 are arranged between the gate electrode 103 and the side surface or surfaces of the trench 125, respectively. As in the embodiments shown in FIGS. 1 and 2, a tunnelling dielectric layer 142 is arranged between the semiconductor body 101 (particularly the side surfaces of the trench 125) and the floating electrode 105, and gate dielectric layers 141 are arranged between the floating electrodes 105 and the gate electrode 103. The lower portion of the gate electrode 103 is insulated from the semiconductor body 101 by insulation 104.

At the second surface 112 of the semiconductor body 101, an emitter region 116 is formed in the semiconductor body 101. An optional field stop layer 119 of the second conductivity type can be formed between the emitter region 116 and the drift region 114. Again, pn-junctions 131, 132 and 133 are formed between the respective regions. It goes without saying that this embodiment can be modified to have a tunnelling dielectric layer with different thickness similar to the embodiment shown in FIG. 2.

Although the above embodiments refer to IGBTs it is also possible to provide power field effect transistors with a floating electrode. Power field effect transistors have a similar arrangement as IGBTs but do not comprise an emitter region.

Power semiconductor devices are, contrary to CMOS devices or memory devices, designed to control large currents such as of at least 1 A. Further, they typically comprise at least two cells or a plurality of cells, which have a common gate structure, i.e. the gate electrodes of the cells are connected with each other. Moreover, the source regions of the cells are also connected to each other. On the backside of the power semiconductor device, a common collector electrode (back metallization) is formed. The cells are therefore connected parallel to each other. Furthermore, power semiconductor devices typically control a vertical current flow, i.e. they are designed to control a load current from the first surface to the opposite second surface of the semiconductor body 1. The embodiments of FIGS. 1 to 3 are devices for controlling a vertical current.

Each cell of the power semiconductor device can comprise a separate floating electrode formed as a segment. Typically, the number of the segments corresponds to the number of the cells. Alternatively, the power semiconductor device can comprise a common floating electrode for all cells.

Figure 4:
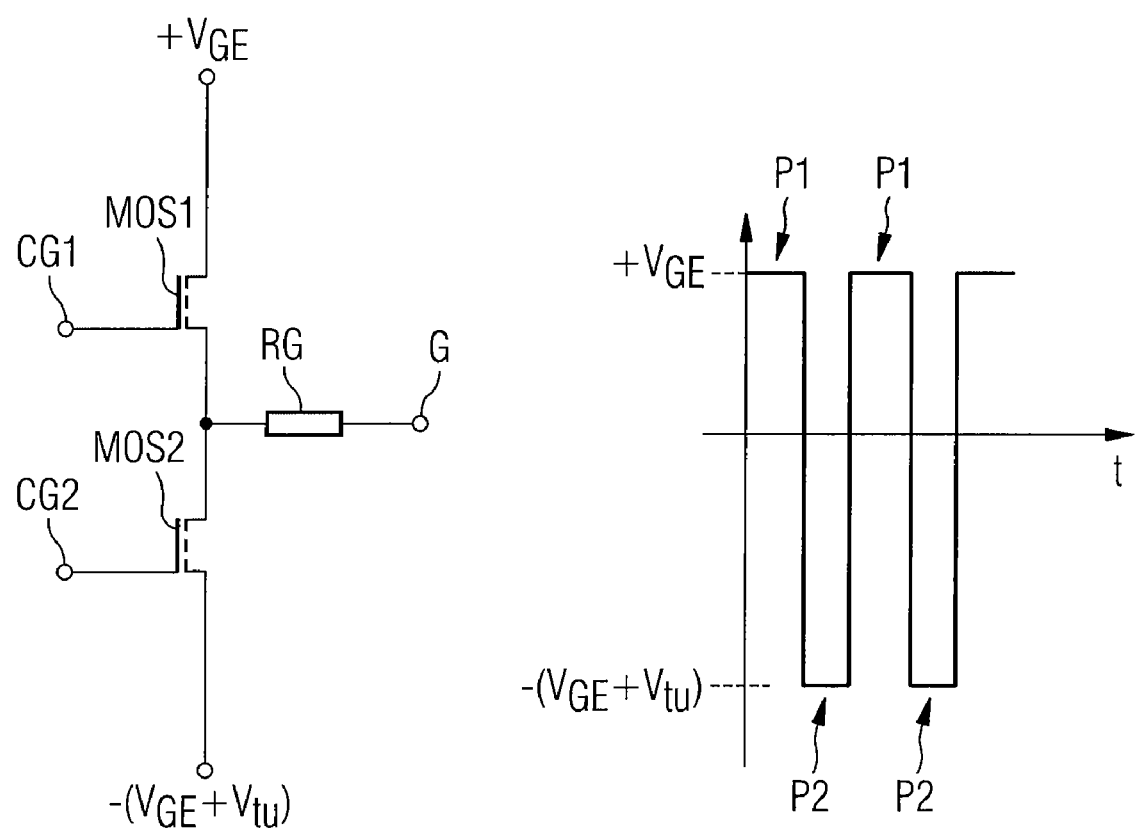
FIG. 4 shows a gate driver according to an embodiment for controlling a power semiconductor device.

With respect to FIG. 4, a method for operating the power semiconductor device will be described. Power semiconductor devices are often used as inverters based on pulse-width modulation (PWM). To this end, the power semiconductor device operates in a pulsed mode to control the current in a load circuit. To allow a load current to flow through the power semiconductor device, a voltage pulse P1 or a plurality of pulses P1 (first control voltage+VGE) is applied to the gate electrode 3 of the power semiconductor device. The first control voltage is sufficiently high to cause formation of a conductive channel in the body region 18. The width of the pulses P1 can vary. After each "positive" pulse P1, a "negative" pulse P2 will be applied to the gate electrode 3. The pulse P2 has a voltage (second control voltage−(VGE+Vtu)) which is of reverse polarity with respect to the voltage of pulse P1 to shut down the power semiconductor device. Pulses P1 and P2 can be applied alternatingly to the gate electrode 3. In the embodiments, pulses P2 have an absolute value which is higher than the absolute value of pulses P1. In addition to shutting down the conductive channel, pulses P2 are for removing any charge carriers from the floating gate 5 so that the threshold voltage will return to Vth0 if it was shifted by trapped charge carriers. This operation mode ensures that after each pulse P1 the power semi-conductor device can operate in normal mode (with threshold voltage Vth0).

For controlling the power semiconductor device a gate driver is used. An example of such a gate driver is shown in FIG. 4. The gate driver comprises a first switching element MOS1 for selectively connecting the gate contact G of the power semiconductor device with a first voltage source which provides a first voltage (first control voltage+VGE in this embodiment). A second switching element MOS2 selectively connects the gate contact G of the power semiconductor device with a second voltage source which provides a second voltage (second control voltage−(VGE+Vtu) in this embodiment). The second control voltage is of reverse polarity to and has a higher absolute value than the first control voltage. The first and second switching elements MOS1 and MOS2, respectively, are controlled by signals applied to respective control gates CG1 and CG2 of the switching elements. Further, the first and second switching elements MOS1 and MOS2 are connected to the gate driver by a resistor RG.

The gate drive is generally arranged for selectively applying one of the first control voltage (VGE) and the second control voltage−(VGE+Vtu) to the gate electrode. The second control voltage−(VGE+Vtu) is applied at least as one short pulse and its absolute value and duration are selected such that a second tunnelling current 9 is generated which substantially discharges the floating electrode 5. Alternatively, the second control voltage can also be repeatedly applied if desired. By applying the second control voltage to the gate contact G, the power semiconductor device can assume the original threshold voltage Vth0. The absolute value of the second control voltage−(VGE+Vtu) exceeds the absolute value of the first control voltage+VGE by the amount of Vtu. Vtu is the additional amount of voltage needed for generating the tunnelling current (indicated by arrow 9 in FIG. 1 and 2) that removes charge carriers from the floating gate. For the embodiment shown in FIG. 2 the value of Vtu can be significantly reduced in comparison to the embodiments shown in FIG. 1 and 3. In the embodiment shown in FIG. 2 the thickness D2 of the tunnelling dielectric between floating gate 5 and source region 10 is reduced in order to allow a tunnelling current at lower absolute values of gate voltage in comparison to the embodiments shown in FIG. 1 and 3.

Figure 5:
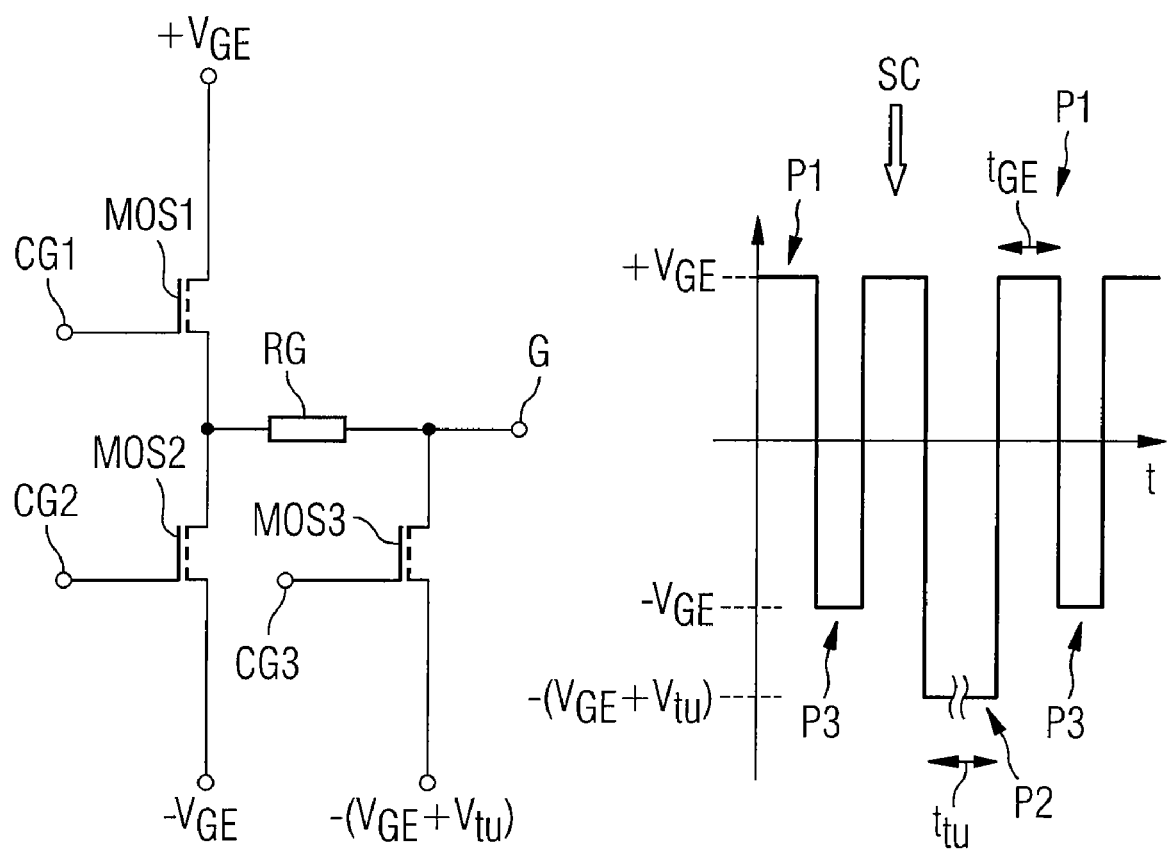
FIG. 5 shows a gate driver according to another embodiment for controlling a power semiconductor device.

FIG. 5 shows another embodiment of a gate driver which can also be used in connection with any of the embodiments shown in FIGS. 1 to 3. In this mode of operation, the second pulse P2 is applied only when a short circuit SC has been detected. The gate driver comprises, in addition to the first and second switching elements MOS1 and MOS2, a third switching element MOS3 which is directly connected to the gate contact G of the power semiconductor device. The third switching element MOS3 comprises a third control gate CG3 and is for selectively applying the second control voltage −VGE+Vtu), which is of reverse polarity with respect to the first control voltage, to the gate contact G of the power semiconductor device. In this embodiment, second switching element MOS2 is for selectively applying a third control voltage−VGE, which is of reverse polarity with respect to the first control voltage (VGE). For normal operation, the first and the third control voltages are alternatingly applied (by first and second switching element MOS1 and MOS2, respectively) to the gate contact G of the power semiconductor device to alternatingly turn it on and off. The width of the respective pulses P1 and P3 can vary. In the event that a short circuit SC has occurred, the second control voltage is selectively applied to the gate contact G through the third switching element MOS3 to discharge the floating electrode 5 (selective operation). To this end, a detection unit for monitoring the load circuit and detecting a short circuit SC is provided (not shown). The detection unit triggers the gate driver by applying a signal to the control gate (third control gate CG3) of the third switching element MOS3 which in turn causes the third switching element MOS3 to connect the gate contact G with the second control voltage.

The control voltages are defined with respect to the body region 18.

The pulse width ttu of the second control voltage (pulse P2) can be appropriately selected and is typically in the range between about 1 ms and about 100 ms. The absolute value of the second control voltage again depends on the thickness of the tunnelling dielectric layer 42. If the tunnelling dielectric layer 42 has a constant thickness as is the case in the embodiments shown in FIG. 1 and 3, the absolute value of the second control voltage will typically be higher than the absolute value of the first control voltage needed for forming a conductive channel. On the other hand, if the tunnelling dielectric layer 42 has a reduced thickness D2 in the area of the source region 10, a second control voltage with a lower absolute value (for example equal to the absolute value of the first control voltage) can be used depending on the thickness D2. It goes without saying that the third control voltage (pulse P3) for interrupting the current flowing through the power semiconductor device can have a value different to −VGE provided that it is sufficiently lower (for example zero) than the first control voltage to reliably shut down the power semiconductor device.

The power semiconductor device, the gate driver and the optional detection unit can be embodied as an electronic device.

Figure 6A:
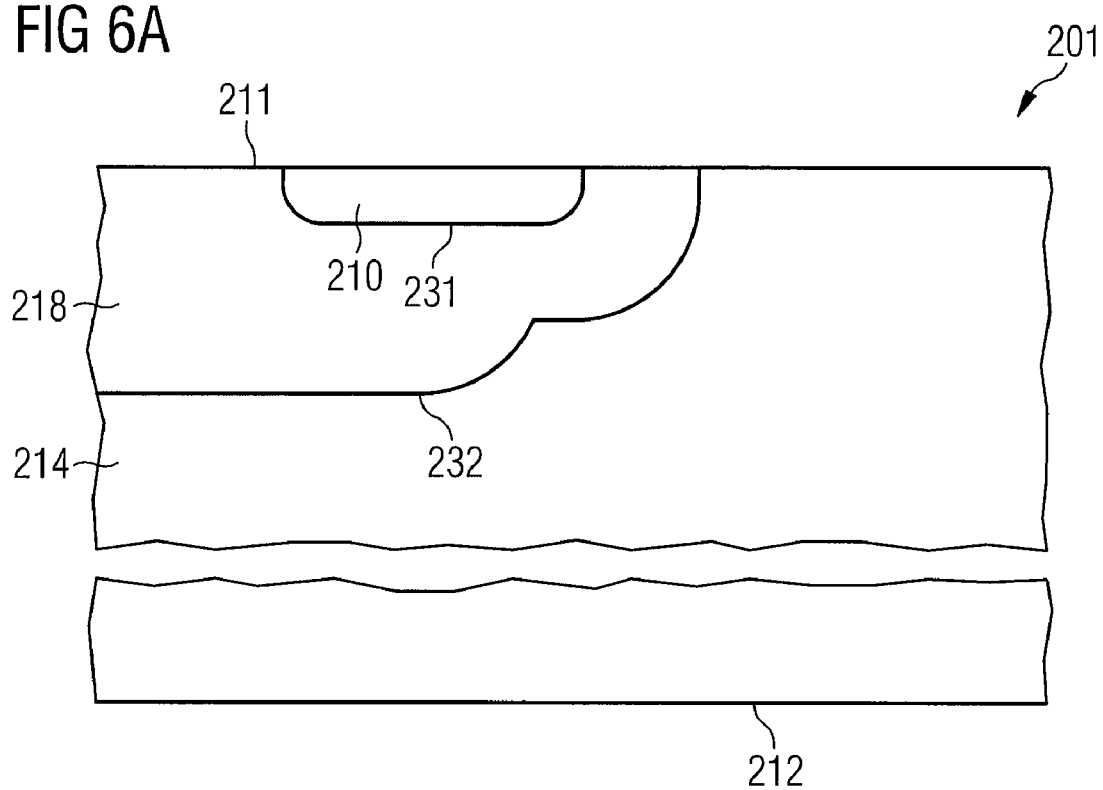
FIGS. 6A to 6D show steps of a method for manufacturing a power semiconductor device.

Subsequently, a method for manufacturing a power semiconductor device will be described in conjunction with FIGS. 6A to 6D. A semiconductor body 201 of a second conductivity type comprising a first surface 211 and a second surface 212 opposite to the first surface 211 is provided. A body region 218 of a first conductivity type is formed in the semiconductor body 201 on the first surface 211, for instance by implantation. Further, a source region 210 of a second conductivity type is formed in the semiconductor body 201, typically by implantation, such that the source region 210 is embedded in the body region 218. The implanted dopants can be driven into the semiconductor body 201 by an appropriate annealing step. This results in the formation of a pn-junction 231 between the source region 210 and the body region 218 and a pn-junction 232 between the body region 218 and a drift region 214 formed by the background doping of the semiconductor body 210. The resulting structure is shown in FIG. 6A.

Figure 6B:
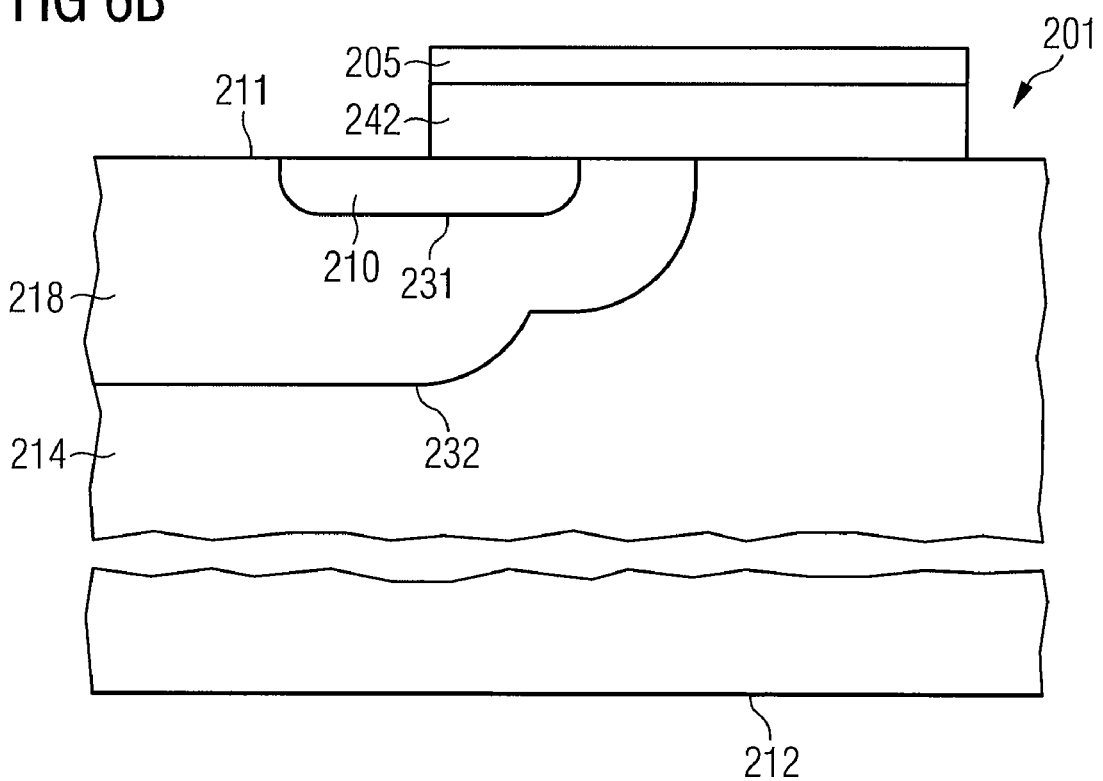

In a subsequent step, a tunnelling dielectric layer 242 is formed on the first surface 211 of the semiconductor body 201, particularly in the area of the body region 218 between the drift region 214 and the source region 210. The tunnelling dielectric layer 242 can be formed for instance by thermally growing a thin oxide layer or by depositing an insulating material. On the tunnelling dielectric layer 242, a floating electrode 205 is formed, for example by depositing a highly doped polysilicon layer which can be subsequently structured. The resulting structure is illustrated in FIG. 6B.

Alternatively, the tunnelling dielectric layer 242 can be formed such that its thickness above the source region 210 is smaller than its thickness above the body region 218. This will also lead to a step-like structure of the floating electrode 205 as shown in FIG. 2.

Figure 6C:
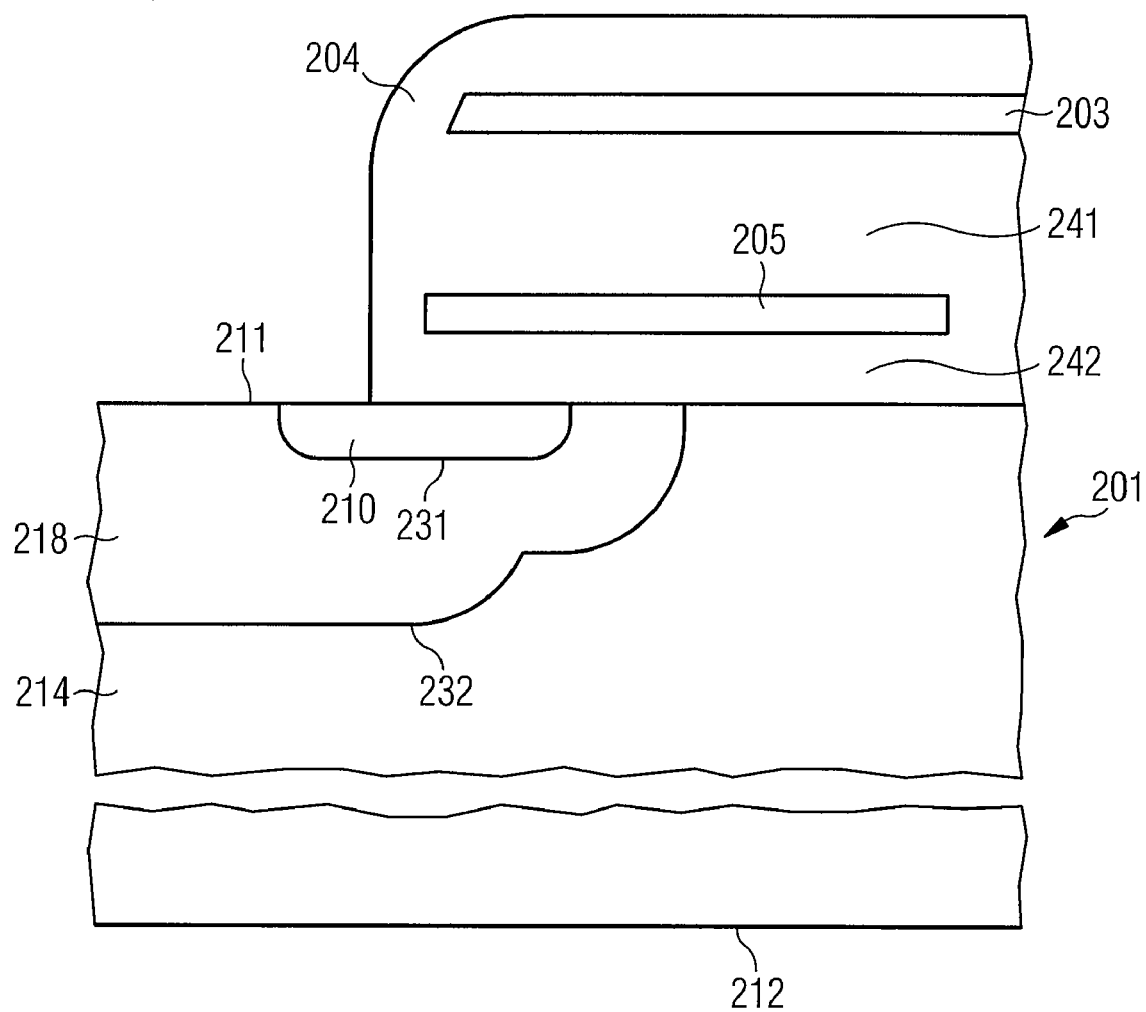

In subsequent steps, a gate dielectric layer 241 is formed on the floating electrode 205, and a gate electrode 203 is formed on the gate dielectric layer 241. The gate dielectric layer 241 is typically a deposited oxide, while the gate electrode 203 could again be comprised of a highly doped polysilicon. The resulting layer stack is structured to dispose portions of the source region 210 and the body region 218 as shown in FIG. 6C. The layer stack is covered with insulation 204. The floating electrode 205 laterally extends from above the source region 210 to above the drift region 214 and completely covers the body region 218 between the source region 210 and the drift region 214. In this embodiment, the floating electrode 205 is formed as a separate segment but could also extend to adjacent cells. The resulting structure is shown in FIG. 6C.

Figure 6D:
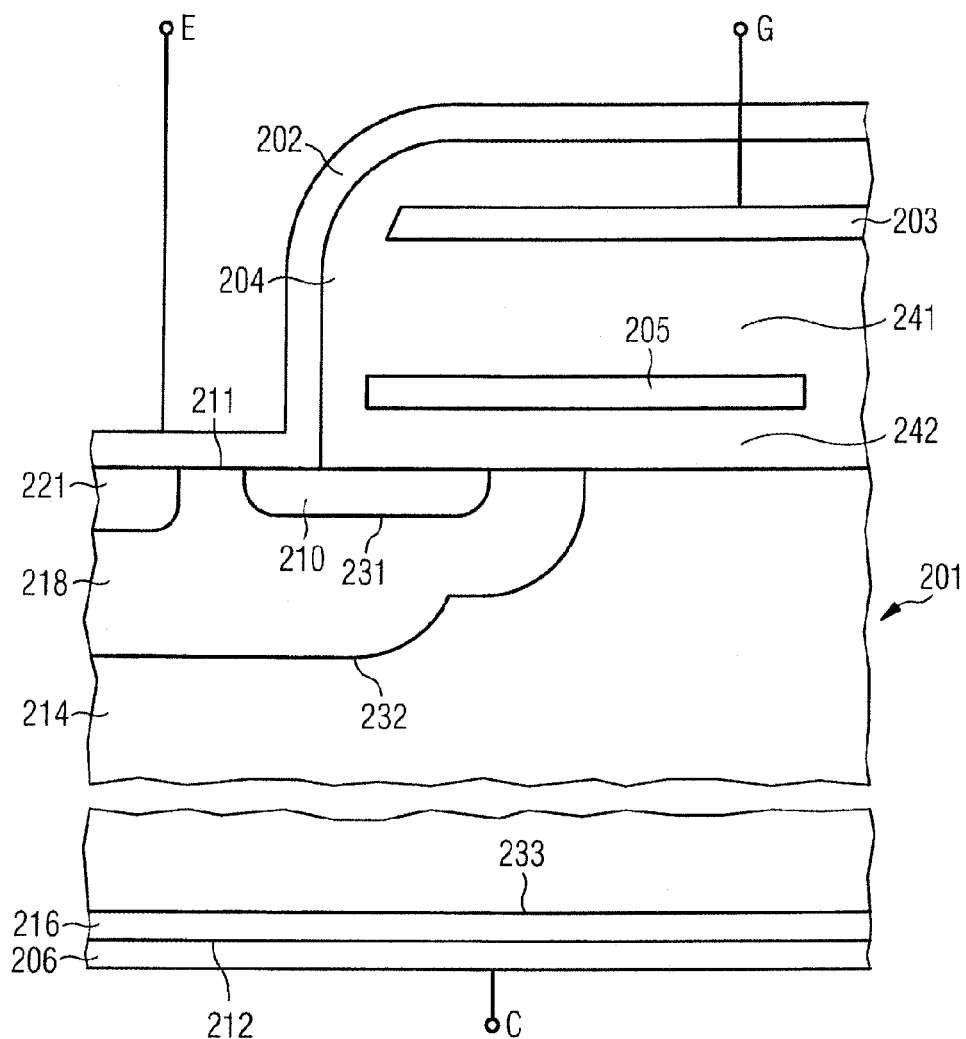

The final steps are illustrated in FIG. 6D and comprise formation of a body contact region 211 in the body region 218 and formation of a front metallization 202 on the first surface 211 to contact the body region 218 and the source region 210. On the second surface 212 an emitter region 216 of the first conductivity type is formed to produces an IGBT. The emitter region 216 will form, after a thermal anneal, a pn-junction 233 with the drift region 214. Instead of an emitter region, a drain region of the second conductivity type can be formed to produce a power-FET. Finally, a back metallization 206 is formed on the emitter region 216 or the drain region.

This written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. The appended claims are considered as a first non-limiting approach to describe the invention in general terms.

What is claimed is:

1. A power semiconductor device, comprising:
   a semiconductor body comprising:
      a plurality of cells, each cell comprising:
         a body region of a first conductivity type;
         a source region of a second conductivity type which is arranged in the semiconductor body and which adjoins the body region for forming a pn-junction between the source region and the body region; and
         a drift region of the second conductivity type in contact with the body region,
         wherein the body region comprises a channel region between the source region and the drift region for forming therein a conductive channel between the source region and the drift region;
         a gate electrode arranged next to the body region;
         a floating electrode arranged between the gate electrode and the channel region of the body region; and
         a tunnelling dielectric layer arranged between the floating electrode and the body region,
   wherein the gate electrodes of the plurality of cells are connected to each other, and the source regions of the plurality of cells are connected to each other.

2. The device of claim 1, wherein the tunnelling dielectric layer is a tunnelling oxide layer.

3. The device of claim 1, wherein the tunnelling dielectric layer has a thickness of less than 20 nm.

4. The device of claim 1, further comprising a gate dielectric layer which is arranged between the floating electrode and the gate electrode.

5. The device of claim 1, wherein the floating electrode comprises a first portion and a second portion, the first portion being arranged next to the body region, and the second portion being arranged next to the source region.

6. The device of claim 5, wherein the first portion has a first distance to the body region and the second portion has a second distance to the source region, the first distance being larger than the second distance.

7. The device of claim 1,
   wherein the tunnelling dielectric layer comprises a first portion and a second portion, the first portion being arranged between the body region and the floating electrode and the second portion being arranged between the source region and the floating electrode.

8. The device of claim 7, wherein the thickness of the first portion of the tunnelling dielectric layer is larger than the thickness of the second portion of the tunnelling dielectric layer.

9. The device of claim 1, wherein the tunnelling dielectric layer is adapted such that it enables a generation of a tunnelling current therethrough for charging the floating electrode.

10. The device of claim 1, wherein the floating electrode of the cells is formed by separate segments, each segment being assigned to a respective cell.

11. The device of claim 1, wherein the gate electrode and the floating electrode are arranged on a first surface of the semiconductor body.

12. The device of claim 11, wherein an emitter region of the first conductivity type is formed on a second surface of the semiconductor body.

13. The device of claim 11, wherein a drain region of the second conductivity type is formed on a second surface of the semiconductor body.

14. The device of claim 1, wherein the gate electrode and the floating electrode are arranged in a trench formed in the semiconductor body.

* * * * *